(12) United States Patent
Yi et al.

(10) Patent No.: US 11,435,849 B2
(45) Date of Patent: Sep. 6, 2022

(54) TOUCH-CONTROLLED DISPLAY PANEL CONFIGURED TO PERFORM SLIDE-SWITCHING BASED ON A TOUCH-AND-SLIDING DIRECTION AND A TOUCH-AND-SLIDING SPEED AND DRIVING METHOD THEREOF, AND TOUCH-CONTROLLED DISPLAYING DEVICE

(71) Applicants: Chengdu BOE Optoelectronics Technology Co., Ltd., Sichuan (CN); BOE Technology Group Co., Ltd., Beijing (CN)

(72) Inventors: Lixiang Yi, Beijing (CN); Hongqiang Luo, Beijing (CN); Kwang Gyun Jang, Beijing (CN); Feng Xiao, Beijing (CN); Guiyu Zhang, Beijing (CN); Mingqiang Wang, Beijing (CN); Xiaoxia Liu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 0 days.

(21) Appl. No.: 17/197,487

(22) Filed: Mar. 10, 2021

(65) Prior Publication Data
US 2022/0019329 A1    Jan. 20, 2022

(30) Foreign Application Priority Data

Jul. 14, 2020    (CN) .......................... 202010675060.9

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0412* (2013.01); *G06F 3/0445* (2019.05);
(Continued)

(58) Field of Classification Search
None
See application file for complete search history.

(56) References Cited

U.S. PATENT DOCUMENTS

2011/0175829 A1* 7/2011 Miyazawa .......... G06F 3/04883
  345/173
2013/0038542 A1* 2/2013 Kim ...................... G06F 3/0443
  345/173

(Continued)

*Primary Examiner* — Kirk W Hermann
(74) *Attorney, Agent, or Firm* — WHDA, LLP (57) ABSTRACT

A touch-controlled display panel comprising: a display screen comprising a displaying region and a non-displaying region surrounding the displaying region; first touch-control electrodes and first touch-control lead wires provided on one side of the display screen, wherein the first touch-control electrodes are insulated and separated from each other and are individually connected to different first touch-control lead wires, and orthographic projections of the first touch-control electrodes and the first touch-control lead wires on the display screen are located within the non-displaying region, and are adjacent to an edge of the display screen; and a driving module connected to all of the first touch-control lead wires and configured for, in response to a touch-and-sliding operation on the touch-controlled display panel by a finger, detecting variations of capacitances corresponding to the first touch-control electrodes and, according to the variations, determining a touch-and-sliding direction and a touch-and-sliding speed to perform slide-switching.

15 Claims, 6 Drawing Sheets

(51) Int. Cl.
G09G 3/3208 (2016.01)
H01L 27/32 (2006.01)

(52) U.S. Cl.
CPC ......... G06F 3/0447 (2019.05); G09G 3/3208 (2013.01); H01L 27/323 (2013.01)

(56) References Cited

U.S. PATENT DOCUMENTS

| | | | |
|---|---|---|---|
| 2014/0028582 A1* | 1/2014 | Choi | G06F 3/0446 345/173 |
| 2019/0051708 A1* | 2/2019 | Jeong | G06F 3/0446 |
| 2020/0203658 A1* | 6/2020 | Peng | H01L 51/5246 |
| 2020/0310575 A1* | 10/2020 | He | H01L 27/3276 |

\* cited by examiner

| in response to a touch-and-sliding operation on the touch-controlled display panel by a finger, detecting variations of capacitances that correspond to each of the plurality of first touch-control electrodes | ~ 901 |

| according to the variations of the capacitances that correspond to each of the plurality of first touch-control electrodes, determining a touch-and-sliding direction and a touch-and-sliding speed, to perform slide-switching to a content displayed in the displaying region | ~ 902 |

Fig. 9

TOUCH-CONTROLLED DISPLAY PANEL CONFIGURED TO PERFORM SLIDE-SWITCHING BASED ON A TOUCH-AND-SLIDING DIRECTION AND A TOUCH-AND-SLIDING SPEED AND DRIVING METHOD THEREOF, AND TOUCH-CONTROLLED DISPLAYING DEVICE

CROSS REFERENCE TO RELEVANT APPLICATIONS

The present disclosure claims the priority of the Chinese patent application filed on Jul. 14, 2020 before the Chinese Patent Office with the application number of 202010675060.9 and the title of "TOUCH-CONTROLLED DISPLAY PANEL AND DRIVING METHOD THEREOF, AND TOUCH-CONTROLLED DISPLAYING DEVICE", which is incorporated herein in its entirety by reference.

TECHNICAL FIELD

The present disclosure relates to the technical field of touch controlling, and particularly relates to a touch-controlled display panel and a driving method thereof, and a touch-controlled displaying device.

BACKGROUND

In watches, the area of the touch-control region is limited. When selecting or sliding is performed by finger touching, because of the smaller sizes of the icons of the user interface and the bigger finger, in the touch controlling the finger will block the sight line, and the problems of erroneous touching and inaccurate touching easily happen, which results in a poor user experience of touch controlling. In order to solve the problems of erroneous touching and inaccurate touching of the finger, a rotary dial plate may be used to replace the intra-regional finger touch controlling to realize the functions such as slide switching and sliding selection.

Rotary dial plates, as an additional controlling function of touch-controlled watches, are increasingly more popular in watch manufacturers and consumers. Currently, mainly used are mechanical rotary dial plates, in which a rotatable outer dial plate is provided on the watch housing, and the rotation of the dial plate can be sensed and identified by a sensor on the mainboard, to realize the actions such as sliding and interface switching.

SUMMARY

The present disclosure provides a touch-controlled display panel and a driving method thereof, and a touch-controlled displaying device.

The present disclosure discloses a touch-controlled display panel, wherein the touch-controlled display panel comprises:

a display screen, wherein the display screen comprises a displaying region and a non-displaying region that surrounds the displaying region;

a plurality of first touch-control electrodes and a plurality of first touch-control lead wires, wherein the plurality of first touch-control electrodes and the plurality of first touch-control lead wires are provided on one side of the display screen, the plurality of first touch-control electrodes are insulated and separated from each other and are individually connected to different instances of the plurality of first touch-control lead wires, and orthographic projections of the plurality of first touch-control electrodes and the plurality of first touch-control lead wires on the display screen are located within the non-displaying region, and are adjacent to an edge of the display screen; and a driving module, wherein the driving module is connected to all of the plurality of first touch-control lead wires, and is configured for, in response to a touch-and-sliding operation on the touch-controlled display panel by a finger, detecting variations of capacitances that correspond to each of the plurality of first touch-control electrodes, and, according to the variations of the capacitances that correspond to each of the plurality of first touch-control electrodes, determining a touch-and-sliding direction and a touch-and-sliding speed, to perform slide-switching to a content displayed in the displaying region.

In an alternative embodiment, the non-displaying region comprises a packaging region and an edge region that surrounds the packaging region, and the orthographic projections of the plurality of first touch-control electrodes on the display screen cover the packaging region and the edge region.

In an alternative embodiment, the non-displaying region further comprises a lead-wire region, the lead-wire region is located on a side of the packaging region that is further away from an edge of the display screen, and orthographic projections of the plurality of first touch-control lead wires on the display screen are located within the lead-wire region.

In an alternative embodiment, a packaging mode of the packaging region is Frit packaging.

In an alternative embodiment, the plurality of first touch-control electrodes are transparent electrodes.

In an alternative embodiment, the plurality of first touch-control lead wires are located on same sides of the plurality of first touch-control electrodes that are further away from an edge of the display screen.

In an alternative embodiment, two of the plurality of first touch-control electrodes are provided in parallel in a normal direction of an edge of the display screen, and trends of variations of areas of the two first touch-control electrodes that are provided in parallel in a same touch-and-sliding direction are opposite.

In an alternative embodiment, the two first touch-control electrodes that are provided in parallel are of a structure in which an adjacent inner ring and an outer ring have gradual transition.

In an alternative embodiment, a distance between the two first touch-control electrodes that are provided in parallel in the normal direction of the edge of the display screen is less than or equal to 10 μm.

In an alternative embodiment, the display screen is a rigid OLED display screen.

In an alternative embodiment, the touch-controlled display panel further comprises: a plurality of second touch-control electrodes and a plurality of second touch-control lead wires, the plurality of second touch-control electrodes and the plurality of second touch-control lead wires are provided on one side of the display screen, the plurality of second touch-control electrodes are insulated and separated from each other and are individually connected to different instances of the plurality of second touch-control lead wires, orthographic projections of the plurality of second touch-control electrodes on the display screen are located within the displaying region, and orthographic projections of the plurality of second touch-control lead wires on the display screen are located within the non-displaying region.

In an alternative embodiment, the driving module is connected to all of the plurality of second touch-control lead wires, and the driving module is further configured for detecting variations of capacitances that correspond to each of the plurality of second touch-control electrodes, and, according to the variations of the capacitances that correspond to each of the plurality of second touch-control electrodes, determining a touched position.

In an alternative embodiment, the plurality of second touch-control electrodes are transparent electrodes.

The present disclosure further discloses a touch-controlled displaying device, wherein the touch-controlled displaying device comprises the touch-controlled display panel according to any one of the above embodiments.

The present disclosure further discloses a driving method for a touch-controlled display panel, wherein the method is used to drive the touch-controlled display panel according to any one of the above embodiments, and the driving method comprises:

in response to a touch-and-sliding operation on the touch-controlled display panel by a finger, detecting variations of capacitances that correspond to each of the plurality of first touch-control electrodes; and according to the variations of the capacitances that correspond to each of the plurality of first touch-control electrodes, determining a touch-and-sliding direction and a touch-and-sliding speed, to perform slide-switching to a content displayed in the displaying region.

In an alternative embodiment, the driving method further comprises:

detecting variations of capacitances that correspond to each of the plurality of second touch-control electrodes; and according to the variations of the capacitances that correspond to each of the plurality of second touch-control electrodes, determining a touched position.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In order to make the above purposes, features and advantages of the present disclosure more apparent and understandable, the present disclosure will be described in further detail below with reference to the drawings and the particular embodiments.

Figure 1:
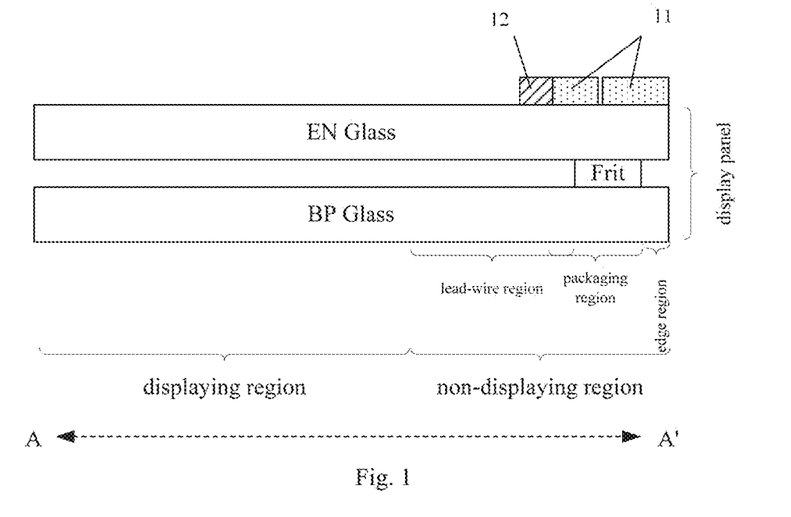
FIG. 1 shows a sectional structural schematic diagram of the touch-controlled display panel according to an embodiment of the present application.

An embodiment of the present application further provides a touch-controlled display panel. Referring to FIG. 1, FIG. 1 shows a sectional structural schematic diagram of the touch-controlled display panel. The touch-controlled display panel may comprise:

a display screen, wherein the display screen comprises a displaying region and a non-displaying region that surrounds the displaying region;

a plurality of first touch-control electrodes 11 and a plurality of first touch-control lead wires 12, wherein the plurality of first touch-control electrodes 11 and the plurality of first touch-control lead wires 12 are provided on one side of the display screen, the plurality of first touch-control electrodes 11 are insulated and separated from each other and are individually connected to different first touch-control lead wires 12, and the orthographic projections of the first touch-control electrodes 11 and the first touch-control lead wires 12 on the display screen are located within the non-displaying region, and are adjacent to the edge of the display screen; and a driving module, wherein the driving module is connected to all of the plurality of first touch-control lead wires 12, and is configured for, in response to a touch-and-sliding operation on the touch-controlled display panel by a finger, detecting the variations of the capacitances that correspond to each of the plurality of first touch-control electrodes 11, and, according to the variations of the capacitances that correspond to each of the plurality of first touch-control electrodes 11, determining the touch-and-sliding direction and the touch-and-sliding speed, to perform slide-switching to the content displayed in the displaying region.

Figure 2:
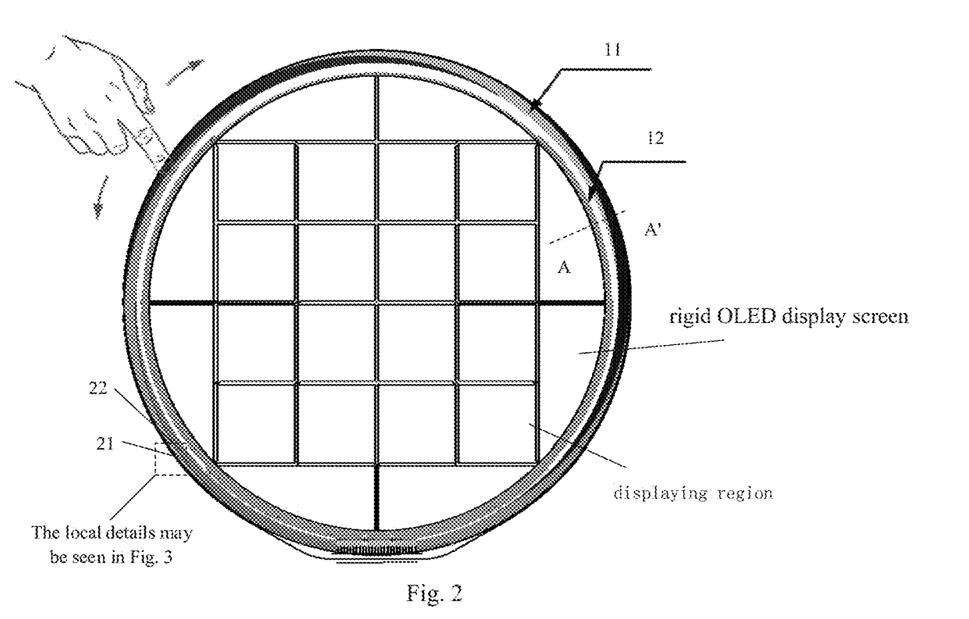
FIG. 2 shows a planar structural schematic diagram of the touch-controlled display panel according to an embodiment of the present application.

The display screen may be a rigid organic light emitting diode (OLED) display screen. The first touch-control electrodes 11 form a touch-control ring on the display screen. Referring to FIG. 2, FIG. 2 shows a planar structural schematic diagram of the touch-controlled display panel according to the present embodiment. FIG. 1 is a schematic structural diagram of the section along the dotted line AA' in FIG. 2.

Figure 4:
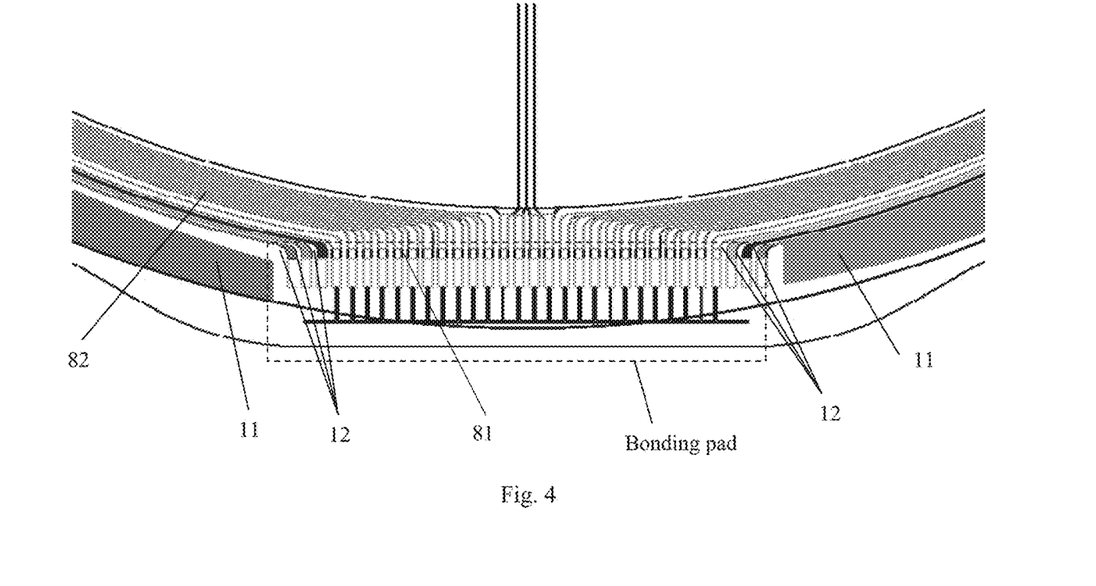
FIG. 4 shows a planar structural schematic diagram of the binding region of the touch-controlled display panel according to an embodiment of the present application.

In practical applications, each of the plurality of first touch-control lead wires 12 may be connected to a bonding-pad region, as shown in FIG. 4, and then be communicatively connected with the driving module (a driving integrated circuit) by FPC bonding.

When a finger is touching and sliding on the edge of the touch-controlled display panel, the driving module detects the capacitances between the finger and each of the plurality of first touch-control electrodes 11, and, according to the trends and the speeds of the variations of the magnitudes of the capacitances between the finger and each of the plurality of first touch-control electrodes 11, identifies the touch-and-sliding direction and the touch-and-sliding speed of the finger, to perform slide-switching to the content displayed in the displaying region, thereby realizing the function of a touch-controlled rotary dial plate (Digital Wheel).

The touch-controlled display panel according to the present embodiment can replace traditional mechanical rotary dial plates to realize the function of rotary controlling of a touch-controlled rotary dial plate, which can reduce the structural parts of the whole machine, simplify the designing of the mechanisms of the whole machine, and reduce the weight of the whole machine. Therefore, it can reduce the cost of the whole machine, reduce the difficulty in designing, and improve the user experience.

In an alternative embodiment, two first touch-control electrodes 11 are provided in parallel in a normal direction of the edge of the display screen, and the trends of the variations of the areas of the two first touch-control electrodes 11 that are provided in parallel in the same touch-and-sliding direction are opposite.

Figure 3:
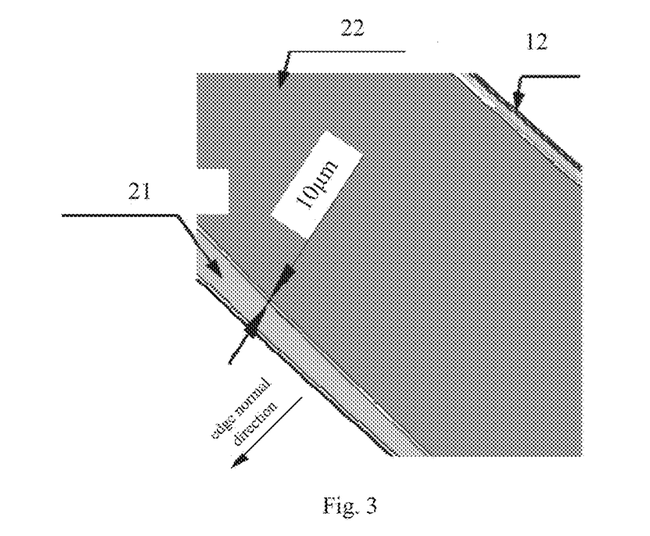
FIG. 3 shows a partially enlarged structural diagram of the touch-controlled display panel according to an embodiment of the present application.

Referring to FIGS. 2 and 3, in the touch-control ring, in a normal direction of the edge of the display screen, two first touch-control electrodes 11 (an outer electrode 21 and an inner electrode 22) are provided in parallel, the cross-sectional view of which may refer to FIG. 1. The trends of the variations of the areas of the outer electrode 21 and the inner electrode 22 in the same touch-and-sliding direction are opposite. When the touch-and-sliding direction is the clockwise direction, the area of the outer electrode 21 gradually increases, and the area of the inner electrode 22 gradually decreases. When the touch-and-sliding direction is the anticlockwise direction, the area of the outer electrode 21 gradually decreases, and the area of the inner electrode 22 gradually increases.

Figure 5:
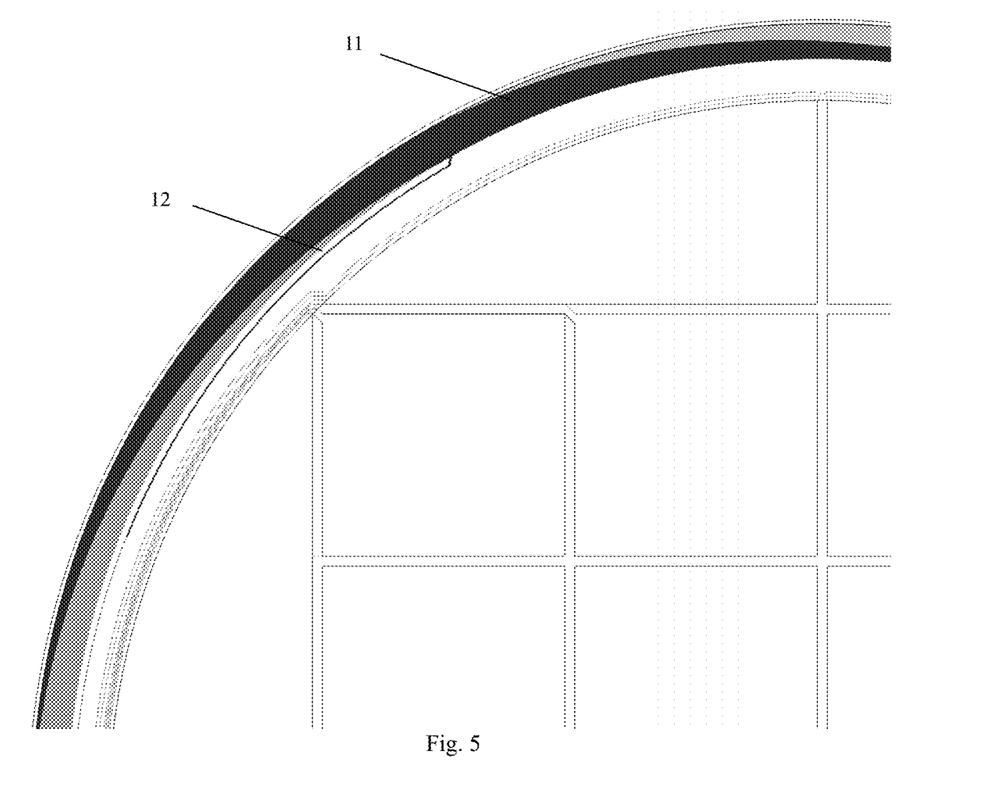
FIG. 5 shows a planar structural schematic diagram of the first region of the touch-controlled display panel according to an embodiment of the present application.
Figure 6:
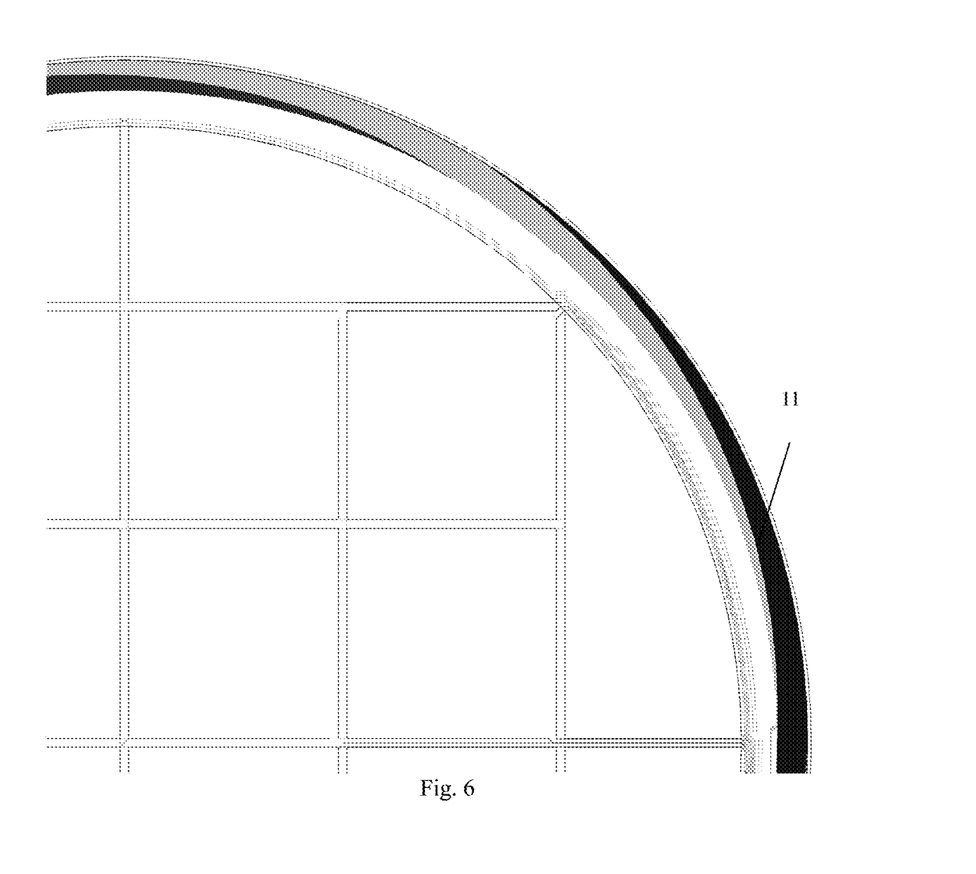
FIG. 6 shows a planar structural schematic diagram of the second region of the touch-controlled display panel according to an embodiment of the present application.
Figure 7:
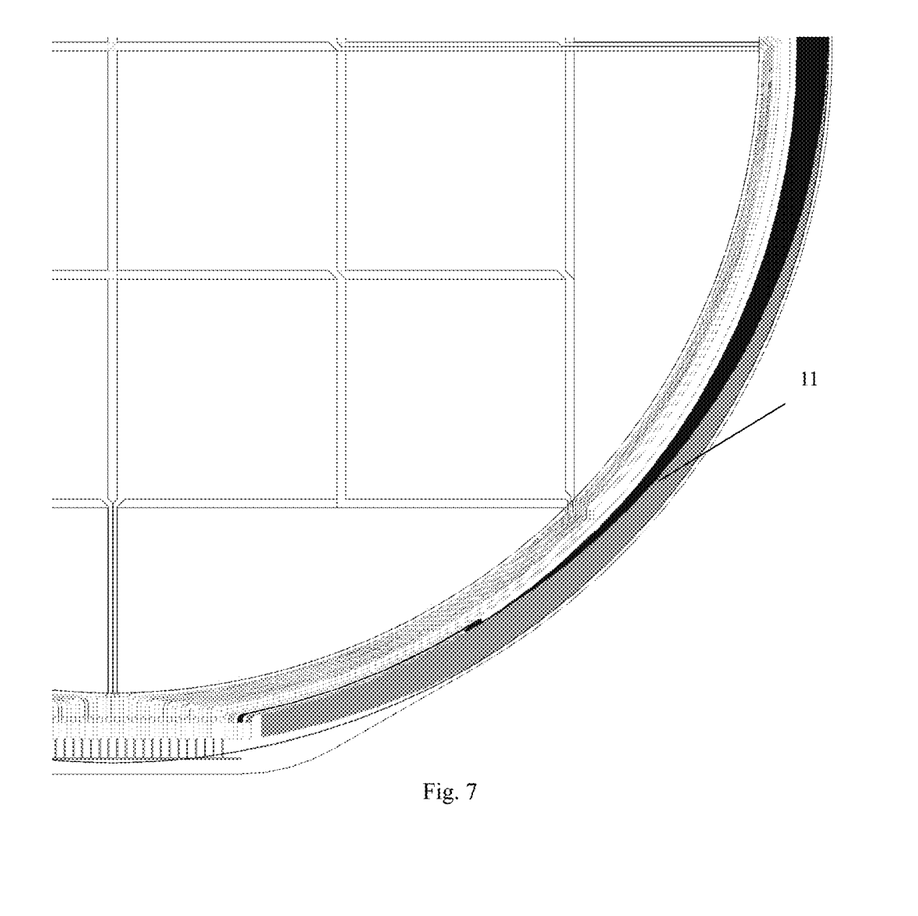
FIG. 7 shows a planar structural schematic diagram of the third region of the touch-controlled display panel according to an embodiment of the present application.

For example, the two first touch-control electrodes that are provided in parallel may be of a structure in which adjacent inner ring and outer ring have gradual transition, as shown in FIG. 2. FIGS. 5, 6 and 7 show partially enlarged schematic structural diagrams of the touch-control ring at different positions. In practical applications, the structure of the first touch-control electrodes is not limited to such a structure, provided that, in the same one touch-and-sliding direction, the two first touch-control electrodes that are provided in parallel have opposite trends of the variations of the areas.

When a finger is touching and sliding along the edge of the dial plate, the contact areas of the adjacent inner electrode 22 and outer electrode 21 with the finger have opposite trends of the variation. For example, when the contact area between the outer electrode 21 and the finger is increasing, the contact area between the inner electrode 22 and the finger is decreasing. Accordingly, the touch-controlling module, by detecting the capacitances formed between each of the plurality of first touch-control electrodes and the finger, and, according to the trends and the speeds of the variations of the magnitudes of the capacitances, can determine the touch-and-sliding direction and the touch-and-sliding speed of the finger, thereby realizing the function of a touch-controlled rotary dial plate (Digital Wheel).

In order to increase the sensitivity of touch controlling, the distance between the two first touch-control electrodes 11 (the outer electrode 21 and the inner electrode 22) that are provided in parallel in the normal direction of the edge of the display screen may be less than or equal to 10 µm, as shown in FIG. 3. Subject to the processing conditions, the distance between the two first touch-control electrodes 11 that are provided in parallel may be reduced to a suitable extent.

In particular implementation, in order to prevent the influence on the first touch-control lead wires 12 by the edge cutting of the display screen, the first touch-control lead wires 12 may be located on the same sides of the first touch-control electrodes 11 that are further away from the edge of the display screen. In other words, the first touch-control electrodes 11 are closer to the edge of the display screen than the first touch-control lead wires 12, and the first touch-control electrodes 11 surround the first touch-control lead wires 12.

Accordingly, because the first touch-control lead wires 12 are located on the inner sides of the first touch-control electrodes 11, they are very far from the heat-affected zone in laser cutting. Therefore, the first touch-control electrodes 11 can be arranged as near the edge as possible, without taking into consideration the influence by the cutting, thereby utilizing the area of the EN glass to the utmost extent, utilizing sufficiently the surface region of the display screen, and enabling a high utilization ratio of the glass-surface region of the wearable products.

In the related art, the touch-control region is enlarged by expanding the touch-control electrodes within the d displaying region, to realize identifying finger sliding at an outer part of the displaying region and in turn realizing simulating the function of a rotary dial plate. However, in such a mode, metal wiring and cut margins are required to be provided at the periphery of the touch-control electrodes. Therefore, the touch-control electrodes cannot be placed at positions adjacent to the edge, and when the finger is sliding, it is required to point the finger to a fixed region inside the edge to enable the finger to be identified. However, the region has no fixed reference, and cannot be accurately touched, and, if the finger slides too outwardly, it might probably be not able to reach the touch-control electrodes, which results in the problems of a low sensitivity of touch controlling and a delayed response, thereby resulting in a poor user experience of touch controlling.

In the present embodiment, because the first touch-control electrodes 11 are closer to the edge of the EN glass, in usage, the user does not need the guiding by any label, and, by merely sliding the finger directly along the edge of the dial plate, the function of touching rotation can be triggered, which can increase the sensitivity of touch controlling of the rotary dial plate, to realize a better experience of rotary touch controlling.

In an alternative embodiment, as shown in FIG. 1, the non-displaying region may comprise a packaging region and an edge region that surrounds the packaging region.

The packaging mode of the packaging region may be Frit packaging. In a normal direction of the edge of the display screen, the width of the Frit-packaging region is approximately 0.4 mm. Moreover, in order to prevent the laser cutting from affecting the effect of packaging, a cut margin, i.e., edge region, is required to be reserved on the side of the Frit packaging that is closer to the edge, with the width of approximately 0.2 mm. Therefore, the non-displaying region has a large room, of approximately 0.6 mm, without a pattern. Therefore, in order to increase the utilization ratio of the surface of the display screen, the orthographic projections of the first touch-control electrodes 11 on the display screen may cover the packaging region and the edge region.

Because the Frit packaging process requires laser illumination on the packaging region from the side of the EN glass, the nontransparent metal wirings such as the first touch-control lead wires 12 are required to avoid the Frit packaging, and the first touch-control electrodes 11 located at the packaging region may be transparent electrodes such as indium tin oxide (ITO). Accordingly, the transparent electrodes do not affect the effect of the Frit packaging.

Referring to FIG. 1, the non-displaying region may further comprise a lead-wire region. The lead-wire region is located on the side of the packaging region that is further away from the edge of the display screen, and the orthographic projections of the first touch-control lead wires 12 on the display screen may be located within the lead-wire region, thereby preventing the influence on the Frit packaging.

The present embodiment, by providing the transparent first touch-control electrodes with a shape of inner and outer gradually changing rings at the packaging region and the edge region of the rigid OLED, realizes the function of a touch-controlled rotary dial plate (Digital Wheel).

Figure 8:
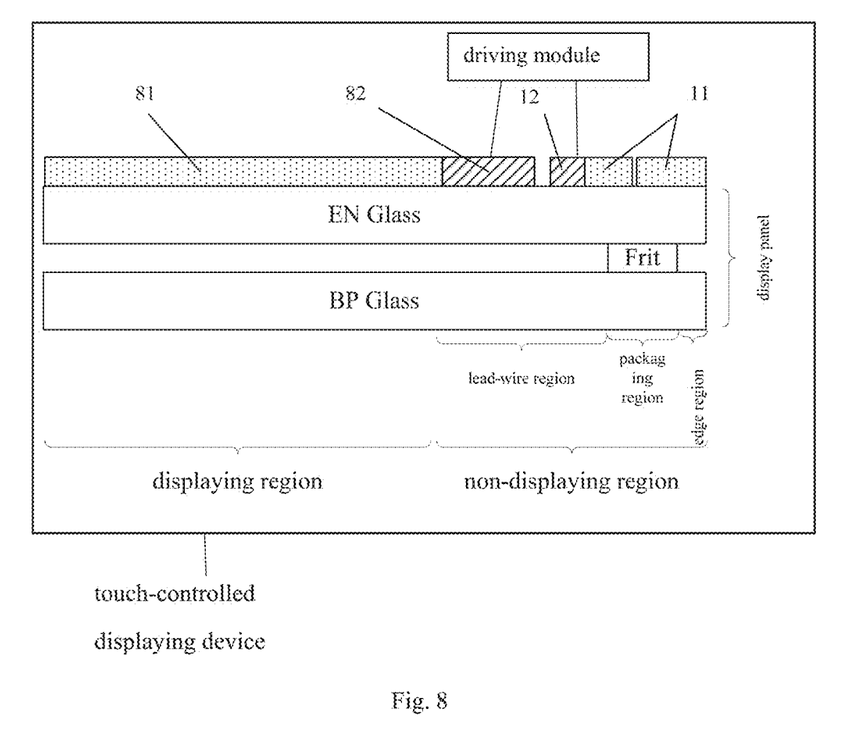
FIG. 8 shows a sectional structural schematic diagram of another touch-controlled display panel according to an embodiment of the present application.

In order to realize the touch-control function of the displaying region of the display screen, in an alternative embodiment, referring to FIG. 8, the touch-controlled display panel may further comprise: a plurality of second touch-control electrodes 81 and a plurality of second touch-control lead wires 82, wherein the plurality of second touch-control electrodes 81 and the plurality of second touch-control lead wires 82 are provided on one side of the display screen, the plurality of second touch-control electrodes 81 are insulated and separated from each other and are individually connected to different second touch-control lead wires 82, the orthographic projections of the second touch-control electrodes 81 on the display screen are located within the displaying region, and the orthographic projections of the second touch-control lead wires 82 on the display screen are located within the non-displaying region.

The driving module is further connected to all of the plurality of second touch-control lead wires 82. The driving module is further configured for detecting the variations of the capacitances that correspond to each of the plurality of second touch-control electrodes 81, and, according to the variations of the capacitances that correspond to each of the plurality of second touch-control electrodes 81, determining the touched position.

In practical applications, each of the plurality of second touch-control lead wires 82 may be connected to the bonding pad, as shown in FIG. 4, and then be communicatively connected with the driving module (a driving integrated circuit) by FPC bonding.

In order not to affect the luminous efficiency of the displaying region, the second touch-control electrodes 81 may be transparent electrodes.

When a finger is touching the displaying region of the display screen, the driving module detects the capacitances between the finger and each of the plurality of second touch-control electrodes 81, and, according to the magnitudes of the capacitances between the finger and each of the plurality of second touch-control electrodes 81, identifies the touched position of the finger, thereby realizing the operations such as clicking and dragging on the contents displayed by the displaying region.

Another embodiment of the present application further provides a touch-controlled displaying device, wherein the touch-controlled displaying device comprises the touch-controlled display panel according to any one of the above embodiments.

It should be noted that the touch-controlled displaying device according to the present embodiment may be a display screen, an electronic paper, a mobile phone, a smart watch, a tablet personal computer, a TV set, a notebook computer, a digital photo frame, a navigator and any other products or components that have the function of 2D or 3D touch-controlled displaying.

Figure 9:
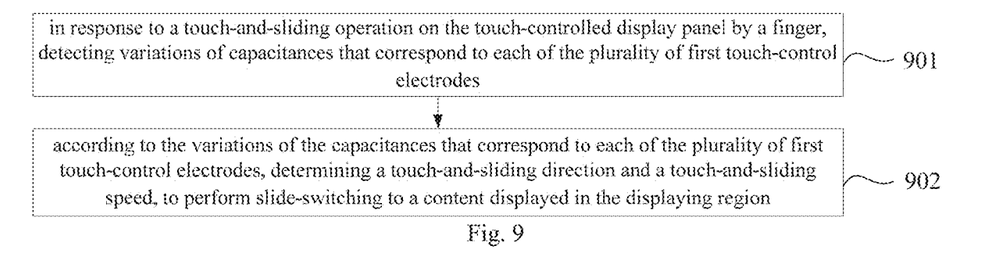
FIG. 9 shows a flow chart of the steps of the driving method for a touch-controlled display panel according to an embodiment of the present application.

Another embodiment of the present application further provides a driving method for a touch-controlled display panel. The driving method may be used to drive the touch-controlled display panel according to any one of the above embodiments. Referring to FIG. 9, the driving method may comprise:

Step 901: in response to a touch-and-sliding operation on the touch-controlled display panel by a finger, detecting variations of capacitances that correspond to each of the plurality of first touch-control electrodes.

Step 902: according to the variations of the capacitances that correspond to each of the plurality of first touch-control electrodes, determining a touch-and-sliding direction and a touch-and-sliding speed, to perform slide-switching to a content displayed in the displaying region.

In particular implementation, the subject that implements the present embodiment may be a driving module, for example, a driving integrated circuit and so on.

When a finger is touching and sliding on the edge of the touch-controlled display panel, the driving module detects the capacitances between the finger and each of the plurality of first touch-control electrodes 11, and, according to the trends and the speeds of the variations of the magnitudes of the capacitances between the finger and each of the plurality of first touch-control electrodes 11, identifies the touch-and-sliding direction and the touch-and-sliding speed of the finger, to perform slide-switching to the content displayed in the displaying region, thereby realizing the function of a touch-controlled rotary dial plate (Digital Wheel).

When the touch-controlled display panel further comprises the second touch-control electrodes and the second touch-control lead wires, the driving method according to the present embodiment may further comprise:

detecting variations of capacitances that correspond to each of the plurality of second touch-control electrodes; and according to the variations of the capacitances that correspond to each of the plurality of second touch-control electrodes, determining a touched position.

When a finger is touching the displaying region of the display screen, the driving module detects the capacitances between the finger and each of the plurality of second touch-control electrodes, and, according to the magnitudes of the capacitances between the finger and each of the plurality of second touch-control electrodes, identifies the touched position of the finger, thereby realizing the operations such as clicking and dragging on the contents displayed by the displaying region.

The particular principle of the driving method for a touch-controlled display panel according to the present embodiment may refer to the description on the above embodiments, and is not discussed here further.

The embodiments of the present application provide a touch-controlled display panel and a driving method thereof, and a touch-controlled displaying device, wherein the touch-controlled display panel comprises: a display screen, wherein the display screen comprises a displaying region and a non-displaying region that surrounds the displaying region; a plurality of first touch-control electrodes and a plurality of first touch-control lead wires, wherein the plurality of first touch-control electrodes and the plurality of first touch-control lead wires are provided on one side of the display screen, the plurality of first touch-control electrodes are insulated and separated from each other and are individually connected to different instances of the plurality of first touch-control lead wires, and orthographic projections of the plurality of first touch-control electrodes and the plurality of first touch-control lead wires on the display screen are located within the non-displaying region, and are adjacent to an edge of the display screen; and a driving module, wherein the driving module is connected to all of the plurality of first touch-control lead wires, and is configured for, in response to a touch-and-sliding operation on the touch-controlled display panel by a finger, detecting variations of capacitances that correspond to each of the plurality of first touch-control electrodes, and, according to the variations of the capacitances that correspond to each of the plurality of first touch-control electrodes, determining a touch-and-sliding direction and a touch-and-sliding speed, to perform slide-switching to a content displayed in the displaying region. The above embodiments of the present application can replace traditional mechanical rotary dial plates to realize the function of a touch-controlled rotary dial plate (Digital Wheel), to reduce the structural parts of the whole machine, reduce the weight of the whole machine, reduce the difficulty in the structural designing and the assembling process, and improve the user experience.

Further, because the first touch-control electrodes are closer to the edge of the dial plate, in usage, the user does not need the guiding by any label, and, by merely sliding the finger directly along the edge of the dial plate, the function of touching rotation can be triggered, which can increase the sensitivity of touch controlling of the rotary dial plate, to realize a better experience of rotary touch controlling.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude an additional same element in the process, method, article or device comprising the element.

The touch-controlled display panel and the driving method thereof, and the touch-controlled displaying device according to the present disclosure has been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Part or all of the modules may be selected according to the actual demands to realize the purposes of the solutions of the embodiments. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A touch-controlled display panel, wherein the touch-controlled display panel comprises:

a display screen, wherein the display screen comprises a displaying region and a non-displaying region that surrounds the displaying region;

a plurality of first touch-control electrodes and a plurality of first touch-control lead wires, wherein the plurality of first touch-control electrodes and the plurality of first touch-control lead wires are provided on one side of the display screen, the plurality of first touch-control electrodes are insulated and separated from each other and are individually connected to different instances of the plurality of first touch-control lead wires, and orthographic projections of the plurality of first touch-control electrodes and the plurality of first touch-control lead wires on the display screen are located within the non-displaying region, and are adjacent to an edge of the display screen; and a driving module, wherein the driving module is connected to all of the plurality of first touch-control lead wires, and is configured for, in response to a touch-and-sliding operation on the touch-controlled display panel by a finger, detecting variations of capacitances that correspond to each of the plurality of first touch-control electrodes, and, according to the variations of the capacitances that correspond to each of the plurality of first touch-control electrodes, determining a touch-and-sliding direction and a touch-and-sliding speed, to perform slide-switching to a content displayed in the displaying region; and the non-displaying region comprises a packaging region and an edge region that surrounds the packaging region, and the orthographic projections of the plurality of first touch-control electrodes on the display screen cover the packaging region and the edge region.

2. The touch-controlled display panel according to claim 1, wherein the non-displaying region further comprises a lead-wire region, the lead-wire region is located on a side of the packaging region that is further away from an edge of the display screen, and orthographic projections of the plurality of first touch-control lead wires on the display screen are located within the lead-wire region.

3. The touch-controlled display panel according to claim 1, wherein a packaging mode of the packaging region is Frit packaging.

4. The touch-controlled display panel according to claim 3, wherein the plurality of first touch-control electrodes are transparent electrodes.

5. The touch-controlled display panel according to claim 1, wherein the plurality of first touch-control lead wires are located on same sides of a plurality of the first touch-control electrodes that are further away from an edge of the display screen.

6. The touch-controlled display panel according to claim 1, wherein the display screen is a rigid OLED display screen.

7. The touch-controlled display panel according to claim 1, wherein the touch-controlled display panel further comprises: a plurality of second touch-control electrodes and a plurality of second touch-control lead wires, the plurality of second touch-control electrodes and the plurality of second touch-control lead wires are provided on one side of the display screen, the plurality of second touch-control electrodes are insulated and separated from each other and are individually connected to different instances of the plurality of second touch-control lead wires, orthographic projections of the plurality of second touch-control electrodes on the display screen are located within the displaying region, and orthographic projections of the plurality of second touch-control lead wires on the display screen are located within the non-displaying region.

8. The touch-controlled display panel according to claim 7, wherein the driving module is connected to all of the plurality of second touch-control lead wires, and the driving module is further configured for detecting variations of capacitances that correspond to each of the plurality of second touch-control electrodes, and, according to the variations of the capacitances that correspond to each of the plurality of second touch-control electrodes, determining a touched position.

9. The touch-controlled display panel according to claim 7, wherein the plurality of second touch-control electrodes are transparent electrodes.

10. A touch-controlled displaying device, wherein the touch-controlled displaying device comprises the touch-controlled display panel according to claim 1.

11. A driving method for a touch-controlled display panel, wherein the method is used to drive the touch-controlled display panel according to claim 1, and the driving method comprises:

in response to a touch-and-sliding operation on the touch-controlled display panel by a finger, detecting variations of capacitances that correspond to each of the plurality of first touch-control electrodes; and according to the variations of the capacitances that correspond to each of the plurality of first touch-control electrodes, determining a touch-and-sliding direction and a touch-and-sliding speed, to perform slide-switching to a content displayed in the displaying region.

12. The driving method according to claim 11, wherein the driving method further comprises:

detecting variations of capacitances that correspond to each of a plurality of second touch-control electrodes; and according to the variations of the capacitances that correspond to each of the plurality of second touch-control electrodes, determining a touched position.

13. A touch-controlled display panel, wherein the touch-controlled display panel comprises:

a display screen, wherein the display screen comprises a displaying region and a non-displaying region that surrounds the displaying region;

a plurality of first touch-control electrodes and a plurality of first touch-control lead wires, wherein the plurality of first touch-control electrodes and the plurality of first touch-control lead wires are provided on one side of the display screen, the plurality of first touch-control electrodes are insulated and separated from each other and are individually connected to different instances of the plurality of first touch-control lead wires, and orthographic projections of the plurality of first touch-control electrodes and the plurality of first touch-control lead wires on the display screen are located within the non-displaying region, and are adjacent to an edge of the display screen; and a driving module, wherein the driving module is connected to all of the plurality of first touch-control lead wires, and is configured for, in response to a touch-and-sliding operation on the touch-controlled display panel by a finger, detecting variations of capacitances that correspond to each of the plurality of first touch-control electrodes, and, according to the variations of the capacitances that correspond to each of the plurality of first touch-control electrodes, determining a touchand-sliding direction and a touch-and-sliding speed, to perform slide-switching to a content displayed in the displaying region, wherein two of the plurality of first touch-control electrodes are provided in parallel in a normal direction of an edge of the display screen, and trends of variations of areas of the two first touch-control electrodes that are provided in parallel in a same touch-and-sliding direction are opposite.

14. The touch-controlled display panel according to claim 13, wherein the two first touch-control electrodes that are provided in parallel are of a structure in which an adjacent inner ring and an outer ring have gradual transition.

15. The touch-controlled display panel according to claim 13, wherein a distance between the two first touch-control electrodes that are provided in parallel in the normal direction of the edge of the display screen is less than or equal to 10 μm.

* * * * *